United States Patent
Yang et al.

(10) Patent No.: US 9,306,464 B2
(45) Date of Patent: Apr. 5, 2016

(54) SYNCHRONOUS RECTIFIER CONTROL CIRCUITS OF POWER CONVERTERS

(71) Applicant: SYNCHRONOUS RECTIFIER CONTROL CIRCUITS OF POWER CONVERTERS, New Taipei (TW)

(72) Inventors: Ta-Yung Yang, Milpitas, CA (US); Chou-Sheng Wang, Keelung (TW)

(73) Assignee: SYSTEM GENERAL CORPORATION, New Taipei (TW)

( * ) Notice: Subject to any disclaimer, the term of this patent is extended or adjusted under 35 U.S.C. 154(b) by 211 days.

(21) Appl. No.: 14/017,426

(22) Filed: Sep. 4, 2013

(65) Prior Publication Data

US 2015/0062972 A1    Mar. 5, 2015

(51) Int. Cl.
  *H02M 3/335* (2006.01)
  *H02M 1/00* (2007.01)
  *H02M 1/08* (2006.01)
  *H02M 3/07* (2006.01)
  *H03K 17/30* (2006.01)

(52) U.S. Cl.
  CPC ............ *H02M 3/33592* (2013.01); *H02M 1/08* (2013.01); *H02M 3/07* (2013.01); *H02M 2001/0006* (2013.01); *H03K 2017/307* (2013.01); *H03K 2217/0081* (2013.01)

(58) Field of Classification Search
  CPC .................. H02M 3/33592; H02M 2001/0006
  See application file for complete search history.

(56) References Cited

U.S. PATENT DOCUMENTS

| | | | |
|---|---|---|---|
| 6,995,991 B1 | 2/2006 | Yang et al. | |
| 7,440,298 B2 | 10/2008 | Yang | |
| 8,072,878 B2 | 12/2011 | Sakauchi et al. | |
| 2002/0141214 A1* | 10/2002 | Grover | 363/125 |
| 2006/0018133 A1* | 1/2006 | Hua | 363/21.01 |
| 2006/0274559 A1* | 12/2006 | Saeueng et al. | 363/21.06 |
| 2007/0014133 A1* | 1/2007 | Shao et al. | 363/52 |
| 2010/0073082 A1* | 3/2010 | Takeshita et al. | 327/581 |
| 2011/0255312 A1* | 10/2011 | Lin et al. | 363/21.16 |

* cited by examiner

*Primary Examiner* — Harry Behm
(74) *Attorney, Agent, or Firm* — McClure, Qualey & Rodack, LLP

(57) ABSTRACT

A synchronous rectifying control circuit of a power converter is provided. The synchronous rectifying control circuit comprises a synchronous rectifying driver, a charge pump capacitor, and a capacitor. The synchronous rectifying driver is coupled to a transformer for generating a control signal to switch a transistor. The charge pump capacitor is coupled to a power source for generating a charge pump voltage. The capacitor is coupled to store the charge pump voltage. The transistor is coupled to the transformer and operated as a synchronous rectifier. The charge pump voltage is coupled to guarantee a sufficient driving capability for the control signal.

10 Claims, 6 Drawing Sheets

SYNCHRONOUS RECTIFIER CONTROL CIRCUITS OF POWER CONVERTERS

BACKGROUND OF THE INVENTION

1. Field of the Invention

The invention related to a control circuit of synchronous rectifying with charge pump to improve efficiency of power converters.

2. Description of the Related Art

Synchronous rectifying technologies had been disclosed in many prior arts such as, U.S. Pat. No. 6,995,991 titled "PWM controller for synchronous rectifier of flyback power converter"; U.S. Pat. No. 7,440,298 titled "Synchronous rectification circuit for power converters"; and U.S. Pat. No. 8,072,787 titled "Synchronous rectifying for soft switching power converters".

FIG. 1 shows a prior art of a power converter with synchronous rectifying. A transistor 20, controlled by a switching signal $S_W$, is coupled to switch a transformer 10 for transferring energy from an input voltage $V_{IN}$ to an output voltage $V_O$ of the power converter. When a rectifier 35 (or the body diode of a transistor 30) is turned on to deliver the power from the transformer 10 to an output capacitor 40, the transistor 30 will be turned on to reduce conduction loss of the rectifier 35 (the forward voltage drop of the rectifier 35). A terminal DET of a synchronous rectifying control circuit 50 is coupled to the transistor 30 and/or the transformer 10 for detecting a signal $S_{DET}$ and achieving the synchronous rectifying. The synchronous rectifying control circuit 50 generates a control signal $V_G$ at its terminal VG in accordance with the signal $S_{DET}$. The control signal $V_G$ is coupled to switch the transistor 30. In the most of the applications, the power source ($V_{CC}$) at a terminal VCC of the synchronous rectifying control circuit 50 is supplied by the output voltage $V_O$ of the power converter. The drawback of these applications is that the voltage level of the control signal $V_G$ cannot sufficiently drive the transistor 30 when the output voltage $V_O$ becomes to a low voltage.

FIG. 2 shows a voltage-to-current curve (the output voltage $V_O$ versus an output current $I_O$) of the power converter. The output voltage $V_O$ would be a low voltage when the power converter is operated in constant current mode. The power source ($V_{CC}$) of the synchronous rectifying control circuit 50 would be too low to let the control signal $V_G$ fully turn on the transistor 30 if the power converter is operated in a region 65, in which the output voltage $V_O$ is relatively low. This will cause low efficiency problem to the power converter.

BRIEF SUMMARY OF THE INVENTION

An exemplary embodiment of a synchronous rectifying control circuit with charge pump of a power converter is provided. The synchronous rectifying control circuit comprises: a synchronous rectifying driver, a charge pump capacitor, a capacitor, a plurality of switches, an oscillator, and a detection circuit. The synchronous rectifying driver is coupled to a transformer for generating a control signal to switch a transistor. The charge pump capacitor is coupled to a power source for generating a charge pump voltage. The capacitor is coupled to store the charge pump voltage. The transistor is coupled to the transformer and operated as a synchronous rectifier. The charge pump voltage is coupled to guarantee a sufficient driving capability for the control signal. The plurality of switches coupled to charge the charge pump capacitor in a switching manner for a charge pump. The oscillator generates an oscillation signal for the switching manner to the charge pump capacitor. The detection circuit is coupled to detect a voltage level of the power source. The detection circuit generates a detection signal when the voltage level of the power source is higher than a threshold. The detection signal is coupled to disable the charge pump and delivering the power source to the capacitor. The control signal is disabled when the charge pump voltage is lower than a low-voltage threshold. The control signal is enabled when the charge pump voltage is higher than a high-voltage threshold.

Another exemplary embodiment of a control circuit for synchronous rectifying of a power converter is also provided. The control circuit comprises: a synchronous rectifying driver, a boost inductor, a capacitor, a switch, an oscillator, and a detection circuit. The synchronous rectifying driver is coupled to a transformer to generate a control signal for switching a transistor. The boost inductor is coupled to a power source for generating a boosted voltage. The capacitor is coupled to store the boosted voltage. The transistor is coupled to the transformer and operated as a synchronous rectifier. The boosted voltage is coupled to guarantee a sufficient driving capability for the control signal. The switch coupled to switch the boost inductor for a boost switching operation. The oscillator generates an oscillation signal for switching the boost inductor. The detection circuit is coupled to detect a voltage level of the power source. The detection circuit generates a detection signal when the voltage level of the power source is higher than a threshold. The detection signal is coupled to disable the boost switching operation and delivering the power source to the capacitor. The control signal is disabled when the boosted voltage is lower than a low-voltage threshold. The control signal is enabled when the boosted voltage is higher than a high-voltage threshold.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
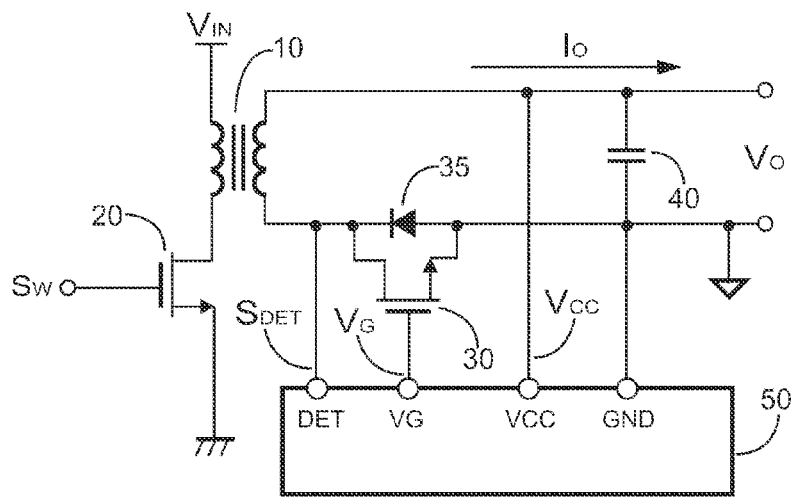
FIG. 1 shows a prior art of a power converter with synchronous rectifying.
Figure 2:
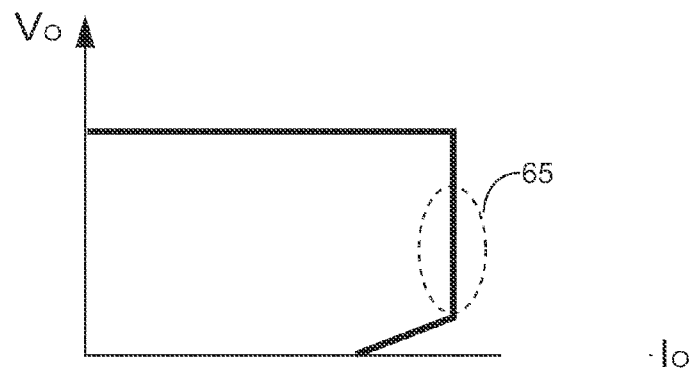
FIG. 2 shows a voltage-to-current curve of an output voltage and an output current of the power converter in FIG. 1.
Figure 3:
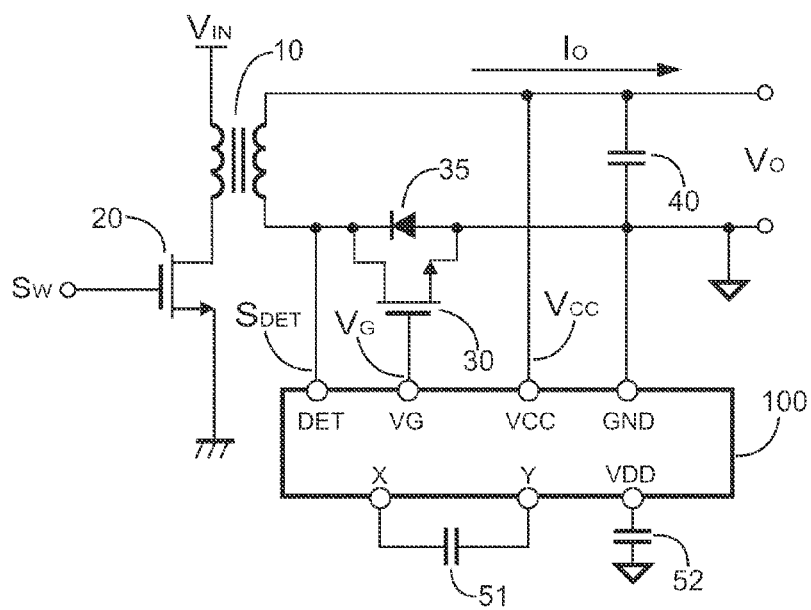
FIG. 3 is an exemplary embodiment of a power converter with synchronous rectifying according to the present invention.

FIG. 3 is an exemplary embodiment of a power converter with synchronous rectifying according to the present invention. A transistor 20, controlled by a switching signal $S_W$, is coupled to switch a transformer 10 for transferring energy from an input voltage $V_{IN}$ to an output voltage $V_O$ of the power converter. When a rectifier 35 (or the body diode of a transistor 30) is turned on to deliver the power from the transformer 10 to an output capacitor 40, the transistor 30 will be turned on to reduce conduction loss of the rectifier 35 (the forward voltage drop of the rectifier 35). The transistor 30 is operated as a synchronous rectifier. A terminal DET of a synchronous rectifying control circuit 50 is coupled to the transistor 30 and/or the transformer 10 for detecting a signal $S_{DET}$ and achieving the synchronous rectifying. The synchronous rectifying control circuit 100 with charge pump is coupled to drive the transistor 30. The synchronous rectifying control circuit 100 is coupled to a charge pump capacitor 51 between its terminals X and Y to boost a $V_{CC}$ voltage (power source) into a capacitor 52 and therefore generate a $V_{DD}$ voltage (charge pump voltage) at a terminal VDD of the synchronous rectifying control circuit 100. The level of the $V_{DD}$ voltage is higher than the level of the $V_{CC}$ voltage. The $V_{DD}$ voltage can guarantee a control signal $V_G$ generated at the terminal VG of the synchronous rectifying control circuit 100 having sufficient driving capability to drive the transistor 30. When the $V_{CC}$ voltage is a high voltage, the synchronous rectifying control circuit 100 will disable the charge pump and directly couple the $V_{CC}$ voltage to the $V_{DD}$ voltage.

Figure 4:
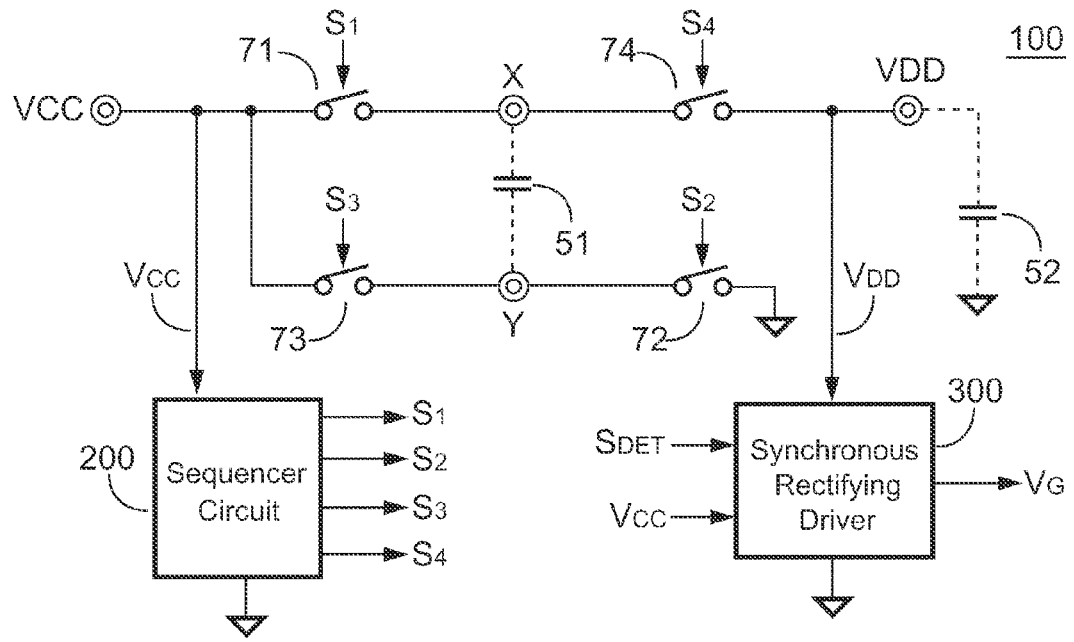
FIG. 4 is an exemplary embodiment of a synchronous rectifying control circuit of the power converter in FIG. 3.

FIG. 4 is an exemplary embodiment of the synchronous rectifying control circuit 100 according to the present invention. The synchronous rectifying control circuit 100 includes a plurality of switches 71, 72, 73, and 74, a sequencer circuit 200, and a synchronous rectifying driver 300. The synchronous rectifying driver 300 is coupled to the transformer 10 for generating the control signal $V_G$ to switch the transistor 30. The switches 71, 72, 73, and 74 are coupled to the charge pump capacitor 51 for generating the $V_{DD}$ voltage. The on/off states of the switches 71, 72, 73, and 74 are respectively controlled by signals $S_1$, $S_2$, $S_3$, and $S_4$ generated by the sequencer circuit 200. The $V_{CC}$ voltage (power source) at a terminal VCC of the synchronous rectifying control circuit 100 is coupled to the sequencer circuit 200 to generate the signals $S_1$, $S_2$, $S_3$, and $S_4$. The $V_{DD}$ voltage is coupled to supply the power source to the synchronous rectifying driver 300. The synchronous rectifying driver 300 generates the control signal $V_G$ in accordance with the $V_{CC}$ voltage and/or the signal $S_{DET}$. The operation of detecting the signal $S_{DET}$ to generate the control signal $V_G$ for driving the transistor 30 is well known to those skilled in the art and therefore will be omitted herein.

Figure 5:
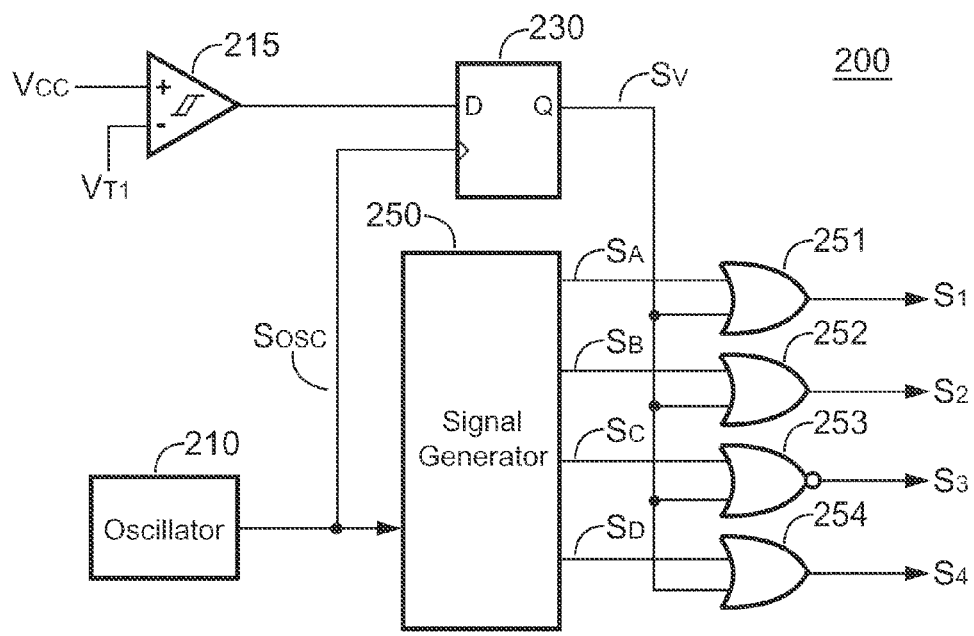
FIG. 5 is an exemplary embodiment of a sequencer circuit of the synchronous rectifying control circuit in FIG. 4.
Figure 6A:
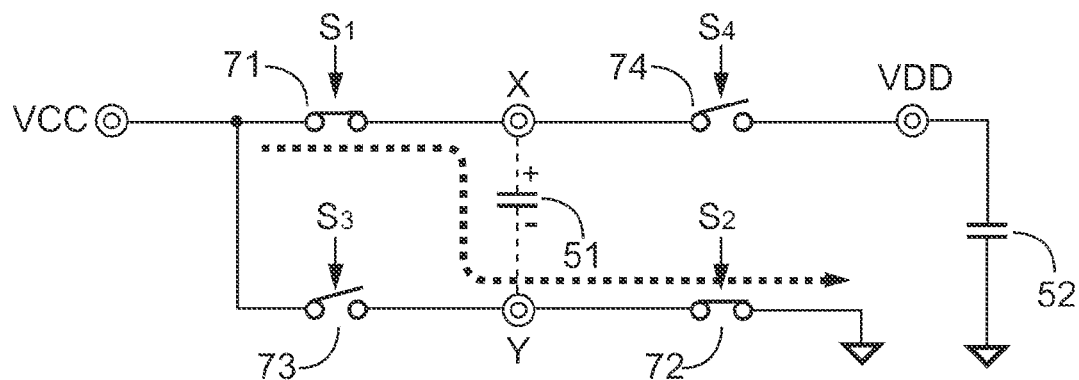
FIGS. 6A and 6B respectively show a first cycle and a second cycle of charge pump of the synchronous rectifying control circuit in FIG. 3.
Figure 6B:
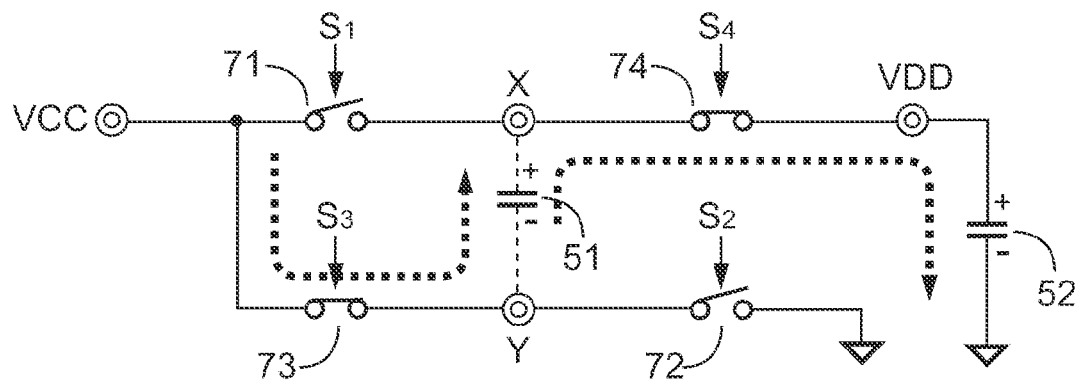
Figure 7:
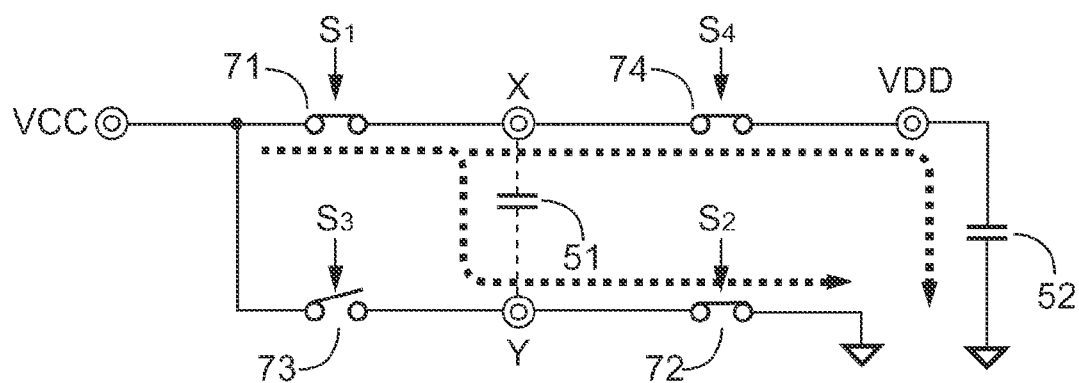
FIG. 7 shows the operation of the synchronous rectifying control circuit in FIG. 3 without charge pump.

FIG. 5 is an exemplary embodiment of the sequencer circuit 200 of the synchronous rectifying control circuit 100 according to the present invention. The sequencer circuit 200 includes an oscillator 210, a comparator 215, a flip-flop 230, a signal generator 250, OR gates 251, 252, and 254, and a NOR gate 253. The oscillator 210 generates an oscillation signal $S_{OSC}$ coupled to the signal generator 250 for generating signals $S_A$, $S_B$, $S_C$, and $S_D$. The comparator 215 and the flip-flop 230 form a detection circuit for detecting the $V_{CC}$ voltage (power source). The comparator 215 receives the $V_{CC}$ voltage (power source) and a threshold $V_{T1}$ and compares the both. The comparator 215 generates a detection signal $S_V$ through the flip-flop 230 when the $V_{CC}$ voltage is higher than the threshold $V_{T1}$. The detection signal $S_V$ and the signals $S_A$, $S_B$, $S_D$, $S_C$ are coupled to generate the signals $S_1$, $S_2$, $S_3$, $S_4$ through the OR gates 251, 252, 254 and the NOR gate 253. In a first cycle (shown in FIG. 6A), the signals $S_1$ and $S_2$ are enabled to turn on the switches 71 and 72 respectively. The voltage across the charge pump capacitor 51 will be charged up to a level same as the level of the $V_{CC}$ voltage. In a second cycle (shown in FIG. 6B), the signals $S_3$ and $S_4$ are enabled to turn on the switches 73 and 74 respectively. The $V_{CC}$ voltage and the voltage across the charge pump capacitor 51 will be added up for charging the capacitor 52. That is, the summed voltage of the $V_{CC}$ voltage and the voltage across the charge pump capacitor 51 will be stored in the capacitor 52. At this time, the level of the $V_{DD}$ voltage will be approximately equal to 2 times the level of the $V_{CC}$ voltage. When the $V_{CC}$ voltage is higher than the threshold $V_{T1}$, the detection signal $S_V$ will be generated to disable the signal $S_3$ and enable the signals $S_1$, $S_2$, and $S_4$ (shown in FIG. 7; the switches 71, 72, and 74 are turned on and the switch 73 is turned off). Therefore, the $V_{CC}$ voltage will be directly coupled to supply as the $V_{DD}$ voltage (the charge pump will be disabled).

Figure 8:
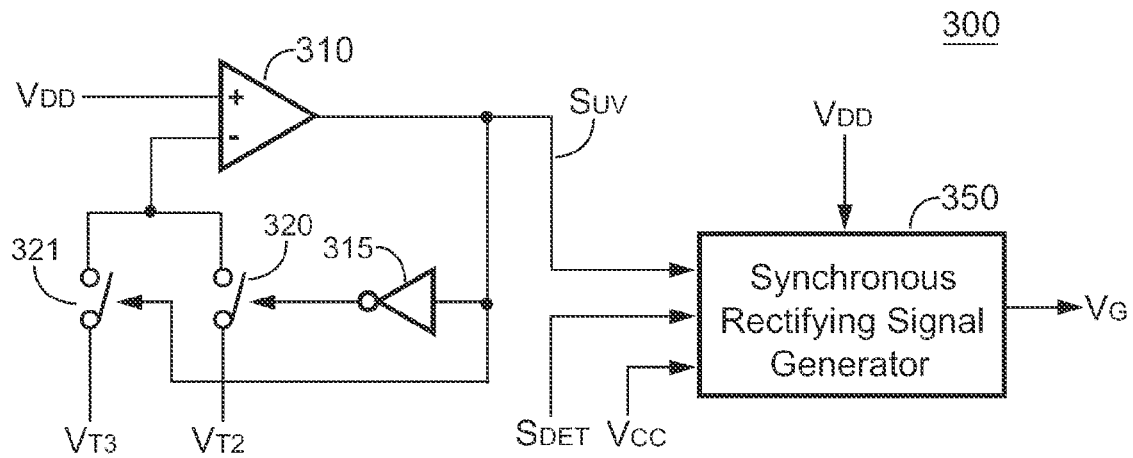
FIG. 8 is an exemplary embodiment of a synchronous rectifying driver of the synchronous rectifying control circuit in FIG. 4.

FIG. 8 is an exemplary embodiment of the synchronous rectifying driver 300. The synchronous rectifying driver 300 comprises a comparator 310, an inverter 315, switches 320 and 321, and a synchronous rectifying signal generator 350. The $V_{DD}$ voltage is couple to supply the power source to the synchronous rectifying signal generator 350. The synchronous rectifying signal generator 350 generates the control signal $V_G$ in accordance with a signal $S_{UV}$ and the $V_{CC}$ voltage and/or the signal $S_{DET}$. The signal $S_{UV}$ is generated (enabled) by the comparator 310 when the $V_{DD}$ voltage is higher than a high-voltage threshold $V_{T2}$. The control signal $V_G$ is enabled when the signal $S_{UV}$ is enabled. The inverter 315 and the switches 320 and 321 form a hysteresis circuit. The signal $S_{UV}$ is disabled when the $V_{DD}$ voltage is lower than a low-voltage threshold $V_{T3}$, wherein the level of the high-voltage threshold $V_{T2}$ is higher than the level of the low-voltage threshold $V_{T3}$. The control signal $V_G$ is disabled when the signal $S_{UV}$ is disabled.

Figure 9:
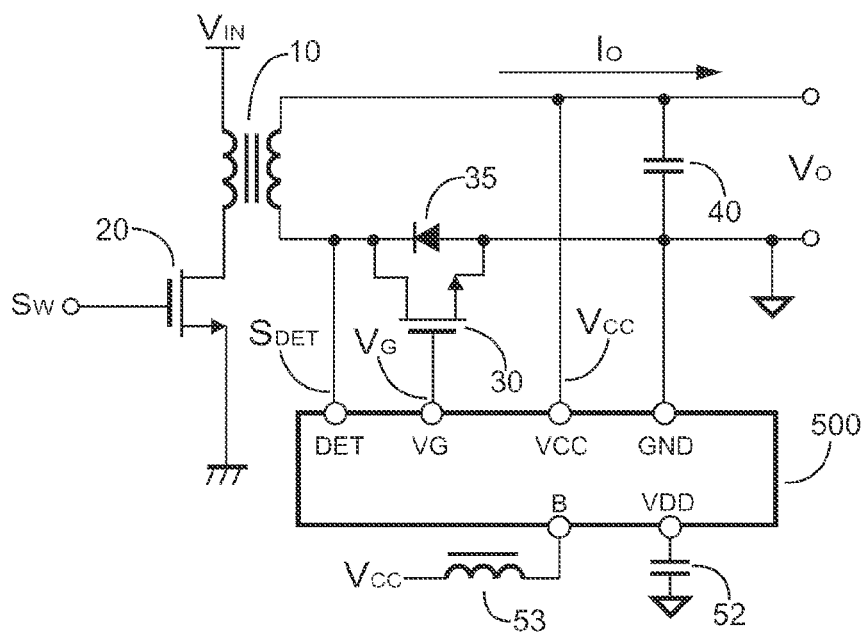
FIG. 9 is another exemplary embodiment of a power converter with synchronous rectifying according to the present invention.

FIG. 9 is another exemplary embodiment of the power converter with synchronous rectifying according to the present invention. A synchronous rectifying control circuit 500 with charge pump is coupled to drive the transistor 30. The synchronous rectifying control circuit 500 is coupled to a boost inductor 53 coupled to its B terminal to boost the $V_{CC}$ voltage (power source) into the $V_{DD}$ voltage (boosted voltage) to be stored in the capacitor 52. The $V_{DD}$ voltage can guarantee a control signal $V_G$ generated at the terminal VG of the synchronous rectifying control circuit 500 having sufficient capability for driving the transistor 30. When the $V_{CC}$ voltage is high voltage, the synchronous rectifying control circuit 500 will disable the boost switching operation and directly couple the $V_{CC}$ voltage to supply as the $V_{DD}$ voltage.

Figure 10:
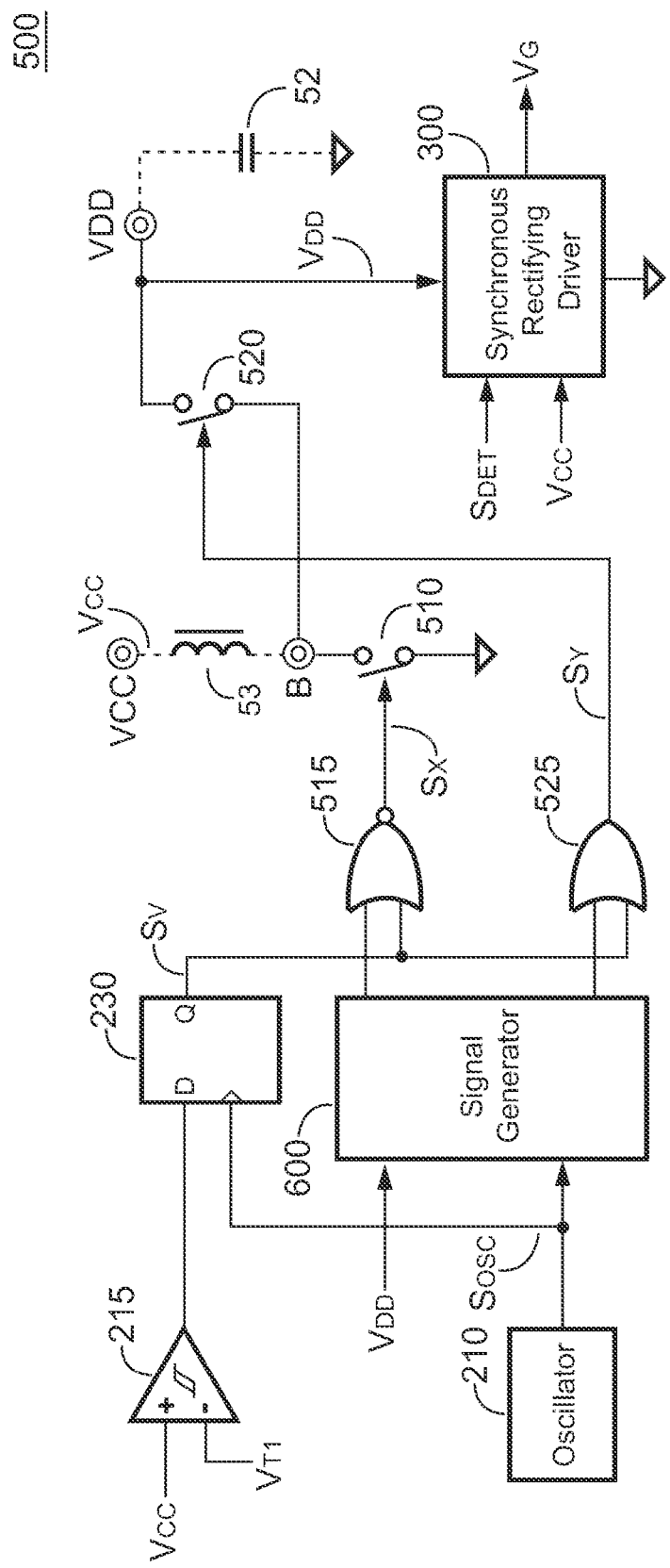
FIG. 10 is an exemplary embodiment of a synchronous rectifying control circuit of the power converter in FIG. 9.

FIG. 10 is an exemplary embodiment of the synchronous rectifying control circuit 500 according to the present invention. The synchronous rectifying control circuit 500 includes an oscillator 210, a comparator 215, a flip-flop 230, a synchronous rectifying driver 300, switches 510 and 520, an NOR gate 515, an OR gate 525, and a signal generator 600. The switches 510 and 520 are coupled to switch the boost inductor 53 for generating the $V_{DD}$ voltage. The on/off states of the switches 510 and 520 are respectively controlled by signals $S_X$ and $S_Y$. The oscillator 210 generates an oscillation signal $S_{OSC}$ coupled to the signal generator 600. In accordance with the level of the $V_{DD}$ voltage, the signal generator 600 is coupled to generate the signals $S_X$ and $S_Y$ via the NOR gate 515 and the OR gate 525 respectively. The comparator 215 generates a detection signal $S_V$ through the flip-flop 230 when the $V_{CC}$ voltage is higher than a threshold $V_{T1}$. In associated with the detection signal $S_V$, the signals $S_X$ and $S_Y$ are generated through the NOR gates 515 and the OR gate 525 respectively. The $V_{DD}$ voltage is coupled to supply the power source to the synchronous rectifying driver 300. The synchronous rectifying driver 300 generates the control signal $V_G$ in accordance the $V_{CC}$ voltage and/or the signal $S_{DET}$.

Figure 11A:
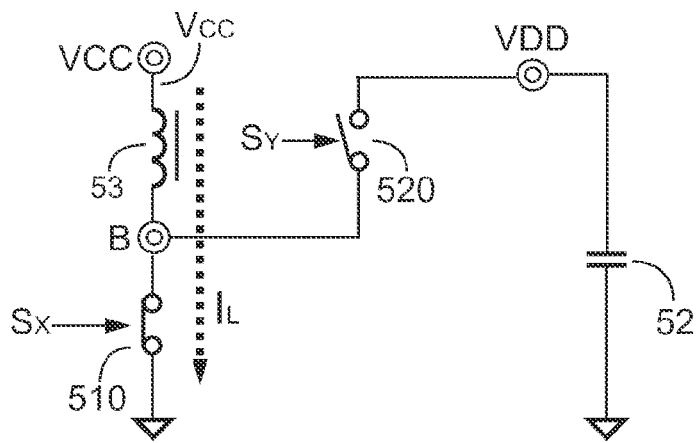
FIGS. 11A and 11B respectively shows a first cycle and a second cycle of a boost switching operation of the synchronous rectifying control circuit in FIG. 9.
Figure 11B:
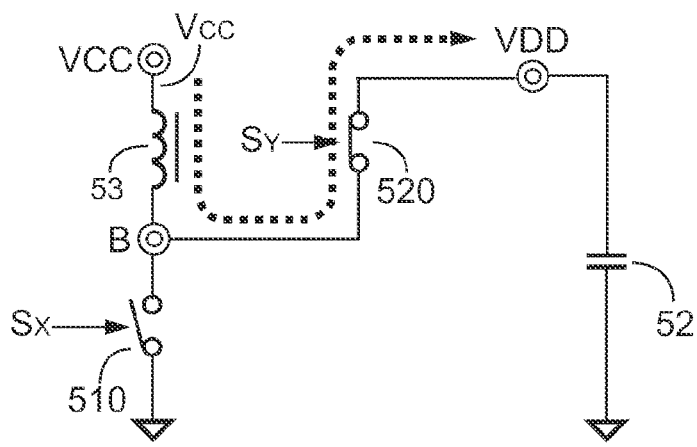

FIGS. 11A and 11B respectively shows a first cycle and a second cycle of a boost switching operation of the synchronous rectifying control circuit 500. Referring to FIG. 11A, the boost inductor 53 is charged through a current $I_L$ when the signal $S_X$ is enabled and the switch 510 is turned on. At this time, the energy stored in the boost inductor 53 generates a boost voltage. Referring to FIG. 11B, the energy of the boost inductor 53 is discharged to charge the capacitor 52 to boost the $V_{DD}$ voltage when the signal $S_Y$ is enabled and the switch 520 is turned on. Accordingly, the boost voltage will be stored into the capacitor 52. Referring to the following equations:

$$I_L = \frac{V_{CC}}{L_{53}} \times T_{ON} \quad (1)$$

$$V_{DD} = \frac{T}{T - T_{ON}} \times V_{CC} \quad (2)$$

wherein $T_{ON}$ is the on time of the switch 510 (the enabling time of the signal $S_X$); T is the switching period of the signal $S_X$; $L_{53}$ is the inductance of the boost inductor 53.

Figure 12:
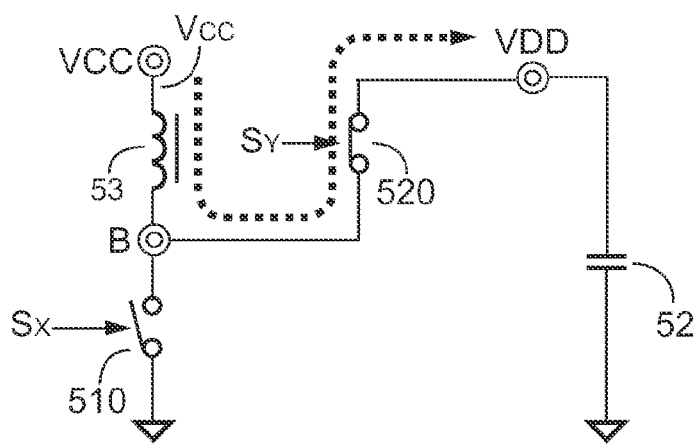
FIG. 12 shows the operation of the synchronous rectifying control circuit in FIG. 9 without boost switching operation.

FIG. 12 shows the charge pump of the synchronous rectifying control circuit 500 without boost switching operation. When the $V_{CC}$ voltage is higher than the threshold $V_{T1}$, the detection signal $S_V$ will be generated to disable the signal $S_X$ and enable the signal $S_Y$. Accordingly, the switch 520 is turned on Therefore, the $V_{CC}$ voltage will be coupled to supply as the $V_{DD}$ voltage (without the boost switching operation).

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A synchronous rectifying control circuit with charge pump of a power converter, comprising:
    a synchronous rectifying driver, coupled to a transformer for generating a control signal to switch a transistor;
    a charge pump capacitor, coupled to a power source;
    a plurality of switches, when a voltage level of said power source is lower than a threshold, coupled to charge said charge pump capacitor by said power source in a switching manner to generate a charge pump voltage for charge pump; and
    a capacitor, coupled to store said charge pump voltage;
    wherein said transistor is coupled to said transformer and operated as a synchronous rectifier; and
    wherein said charge pump voltage is coupled to guarantee a sufficient driving capability for said control signal.

2. The synchronous rectifying control circuit as claimed in claim 1 further comprising an oscillator generating an oscillation signal for said switching manner.

3. The synchronous rectifying control circuit as claimed in claim 1 further comprising:
    a detection circuit, coupled to detect said voltage level of said power source;
    wherein said detection circuit generates a detection signal when said voltage level of said power source is higher than said threshold; and
    wherein said detection signal is coupled to disable said charge pump and delivering said power source to said capacitor.

4. The synchronous rectifying control circuit as claimed in claim 1, wherein said control signal is disabled when said charge pump voltage is lower than a low-voltage threshold.

5. The synchronous rectifying control circuit as claimed in claim 1, wherein said control signal is enabled when said charge pump voltage is higher than a high-voltage threshold.

6. A control circuit for synchronous rectifying of a power converter, comprising:
    a synchronous rectifying driver, coupled to a transformer to generate a control signal for switching a transistor;
    a boost inductor, coupled to a power source;
    a switch; when a voltage level of said power source is lower than a threshold, coupled to switch said boost inductor for a boost switching operation so as to charge said boost inductor by said power source to generate a boosted voltage;
    a capacitor, coupled to store said boosted voltage;
    wherein said transistor is coupled to said transformer and operated as a synchronous rectifier; and
    wherein said boosted voltage is coupled to guarantee a sufficient driving capability for said control signal.

7. The control circuit as claimed in claim 6 further comprising:
    a detection circuit, coupled to detect said voltage level of said power source;
    wherein said detection circuit generates a detection signal when said voltage level of said power source is higher than said threshold; and
    wherein said detection signal is coupled to disable said boost switching operation and delivering said power source to said capacitor.

8. The control circuit as claimed in claim 6 further comprising an oscillator generating an oscillation signal for switching said boost inductor.

9. The control circuit as claimed in claim 6, wherein said control signal is disabled when said boosted voltage is lower than a low-voltage threshold.

10. The control circuit as claimed in claim 6, wherein said control signal is enabled when said boosted voltage is higher than a high-voltage threshold.

* * * * *